United States Patent
Yoneyama et al.

(10) Patent No.: US 11,588,061 B2
(45) Date of Patent: Feb. 21, 2023

(54) PHOTOELECTRIC CONVERSION MODULE AND METHOD FOR MANUFACTURING PHOTOELECTRIC CONVERSION MODULE

(71) Applicant: IDEMITSU KOSAN CO., LTD., Tokyo (JP)

(72) Inventors: Nobutaka Yoneyama, Tokyo (JP); Mikio Hamano, Tokyo (JP); Yoshihide Miyagawa, Tokyo (JP); Toshiaki Yamaura, Tokyo (JP); Akihiko Asano, Tokyo (JP); Manabu Tanaka, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 16/646,948

(22) PCT Filed: Sep. 4, 2018

(86) PCT No.: PCT/JP2018/032775
§ 371 (c)(1),
(2) Date: Mar. 12, 2020

(87) PCT Pub. No.: WO2019/054240
PCT Pub. Date: Mar. 21, 2019

(65) Prior Publication Data
US 2020/0279958 A1    Sep. 3, 2020

(30) Foreign Application Priority Data

Sep. 15, 2017 (JP) .............................. JP2017-178370

(51) Int. Cl.
*H01L 31/00* (2006.01)
*H01L 31/0224* (2006.01)
(Continued)

(52) U.S. Cl.
CPC ............. *H01L 31/022433* (2013.01); *H01L 31/022466* (2013.01); *H01L 31/035272* (2013.01); *H01L 31/1884* (2013.01)

(58) Field of Classification Search
CPC ............................................. H01L 31/022433
See application file for complete search history.

(56) References Cited

U.S. PATENT DOCUMENTS

| 4,590,327 A * | 5/1986 | Nath ............... H01L 31/022433 |
|---|---|---|
| | | 136/256 |
| 2014/0224317 A1* | 8/2014 | Feist ...................... H01L 31/18 |
| | | 136/256 |

FOREIGN PATENT DOCUMENTS

| JP | 2005-519473 A | 6/2005 |
|---|---|---|
| JP | 2011-103425 A | 5/2011 |

(Continued)

OTHER PUBLICATIONS

English machine translation of Miyauchi. (Year: 2022).*
(Continued)

*Primary Examiner* — Angelo Trivisonno
(74) *Attorney, Agent, or Firm* — Foley & Lardner LLP

(57) ABSTRACT

A photoelectric conversion module (10) comprises a photoelectric conversion cell (12) and a grid electrode (31) provided in the photoelectric conversion cell (12) on a substrate. The photoelectric conversion cell (12) includes a first electrode layer (22), a second electrode layer (24), a photoelectric conversion layer (26) between the first electrode layer (22) and the second electrode layer (24). The second electrode layer (24) is formed of a transparent electrode layer located on opposite side of the photoelectric conversion layer (26) to the substrate (20). The grid electrode (31) is provided between the photoelectric conversion layer (26) and the transparent electrode layer.

11 Claims, 8 Drawing Sheets

(51) Int. Cl.
*H01L 31/0352* (2006.01)
*H01L 31/18* (2006.01)

(56) References Cited

FOREIGN PATENT DOCUMENTS

| | | | |
|---|---|---|---|
| JP | 2013-055215 A | 3/2013 | |
| JP | 5220206 B2 * | 6/2013 | ..... H01L 31/022433 |
| JP | 2014-192426 A | 10/2014 | |
| JP | 2014-529185 A | 10/2014 | |
| WO | WO-03/075351 A2 | 9/2003 | |
| WO | WO-2013/019608 A1 | 2/2013 | |

OTHER PUBLICATIONS

International Searching Authority, "International Search Report," issued in connection with International Patent Application No. PCT/JP2018/032775, dated Oct. 30, 2018.
International Searching Authority, "Written Opinion," issued in connection with International Patent Application No. PCT/JP2018/032775, dated Oct. 30, 2018.

* cited by examiner

PHOTOELECTRIC CONVERSION MODULE AND METHOD FOR MANUFACTURING PHOTOELECTRIC CONVERSION MODULE

CROSS-REFERENCE TO RELATED APPLICATIONS

The present application claims priority under 37 U.S.C. § 371 to International Patent Application No. PCT/JP2018/032775, filed Sep. 4, 2018, which claims priority to and the benefit of Japanese Patent Application No. 2017-178370, filed on Sep. 15, 2017. The contents of these applications are hereby incorporated by reference in their entireties.

TECHNICAL FIELD

The present invention relates to a photoelectric conversion module having a grid electrode and a method for manufacturing the photoelectric conversion module.

BACKGROUND ART

A photoelectric conversion module such as a solar battery module including a plurality of photoelectric conversion cells is known (following Patent Literature 1). In an integrated thin-film photoelectric conversion module as described in Patent Literature 1, a photoelectric conversion cell includes a transparent electrode layer located on a light receiving surface, a rear surface electrode layer located on a surface opposite to the light receiving surface, and a photoelectric conversion layer between the transparent electrode layer and the rear surface electrode layer.

An electric resistance value of the transparent electrode layer is generally higher than an electric resistance value of an opaque electrode layer made of metal. Therefore, when a current generated by the photoelectric conversion flows through the transparent electrode layer, a power loss occurs due to the electric resistance value of the transparent electrode layer. In order to reduce the power loss in the transparent electrode layer, a grid electrode (collecting electrode) made of a thin line metal is provided on the transparent electrode layer in some cases.

In the photoelectric conversion module described in Patent Literature 1, the path of the current flowing through the transparent electrode layer is shortened by collecting the current flowing through the transparent electrode layer into the grid electrode. Therefore, power loss due to the electric resistance value of the transparent electrode layer can be reduced. However, connection failure may occur between the grid electrode and the transparent electrode layer, or flux at the time of forming the grid electrode may remain as a residue under the grid electrode, which increases the contact resistance between the grid electrode and the transparent electrode layer in some cases. In this case, the current collecting ability of the grid electrode is reduced, which may cause a decrease in the conversion efficiency of the photoelectric conversion module.

Therefore, a photoelectric conversion module that can suppress a decrease in the current collecting ability of the grid electrode is desired.

CITATION LIST

Patent Literature

Patent Literature 1: JP 2011-103425 A

SUMMARY

A photoelectric conversion module according to one aspect comprises: a photoelectric conversion cell including a first electrode layer, a second electrode layer, a photoelectric conversion layer between the first electrode layer and the second electrode layer on a substrate; and a grid electrode provided in the photoelectric conversion cell, wherein the second electrode layer is formed of a transparent electrode layer located on opposite side of the photoelectric conversion layer to the substrate, and the grid electrode is provided between the photoelectric conversion layer and the transparent electrode layer.

A method for manufacturing a photoelectric conversion module according to one aspect comprises: preparing a substrate on which a first electrode layer and a photoelectric conversion layer are formed; providing a conductive ink for forming a grid electrode on the photoelectric conversion layer; a firing step of firing the conductive ink to form the grid electrode; and a step of forming a second electrode layer on the conductive ink, wherein the firing step is performed by a heat treatment during the step of forming the second electrode layer.

DESCRIPTION OF EMBODIMENTS

Figure 1:
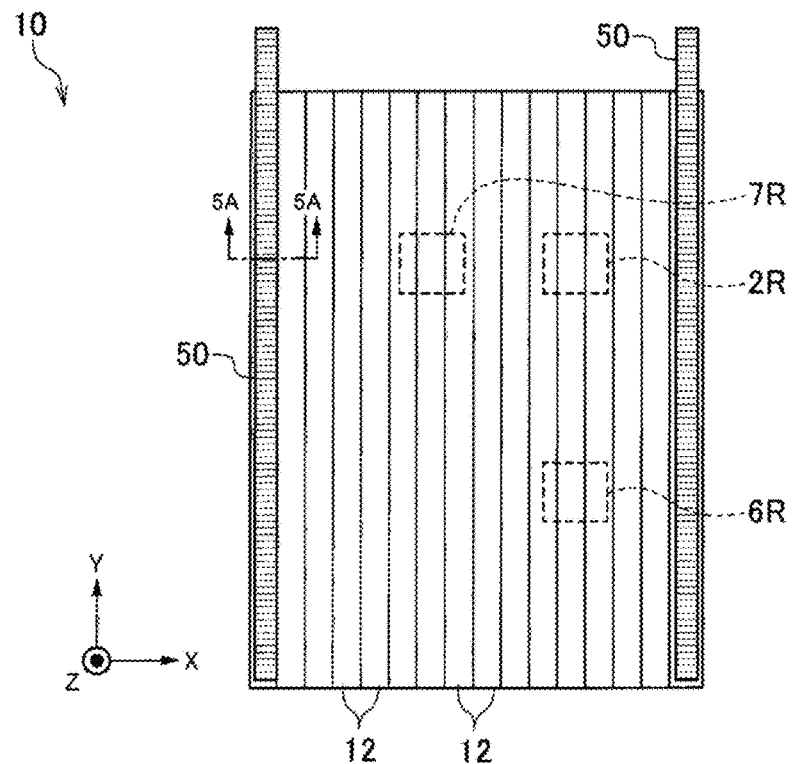
FIG. 1 is a schematic top view of a photoelectric conversion module according to a first embodiment.

Hereinafter, embodiments will be described with reference to the drawings. In the drawings, the same or similar parts are denoted by the same or similar reference numerals. However, it should be noted that the drawings are schematic and ratios or the like of dimensions may be different from actual ones.

First Embodiment

Figure 2:
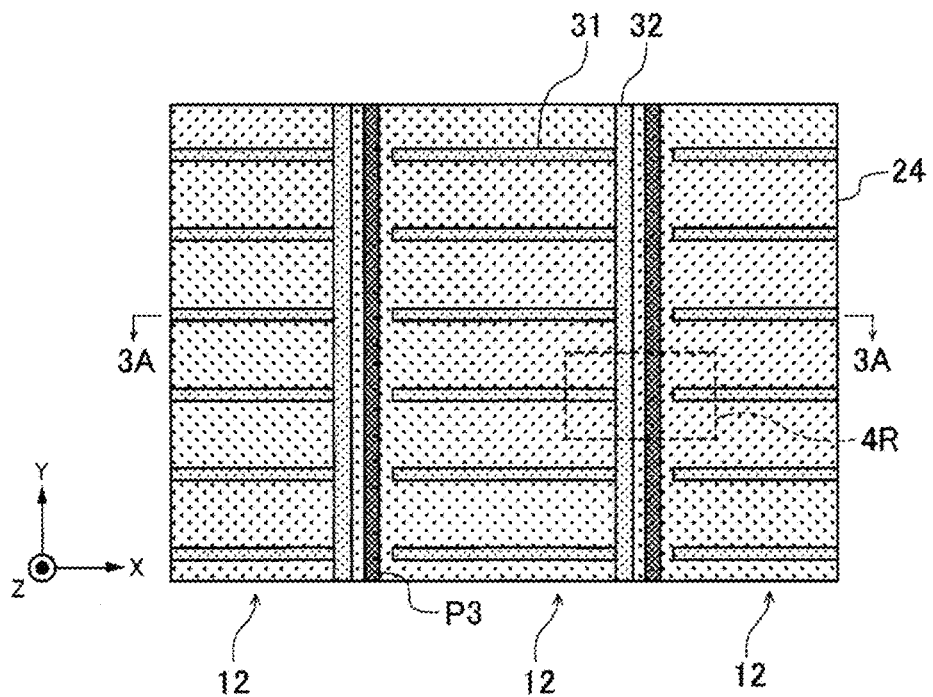
FIG. 2 is a schematic top view of the photoelectric conversion module in a region 2R in FIG. 1.
Figure 3:
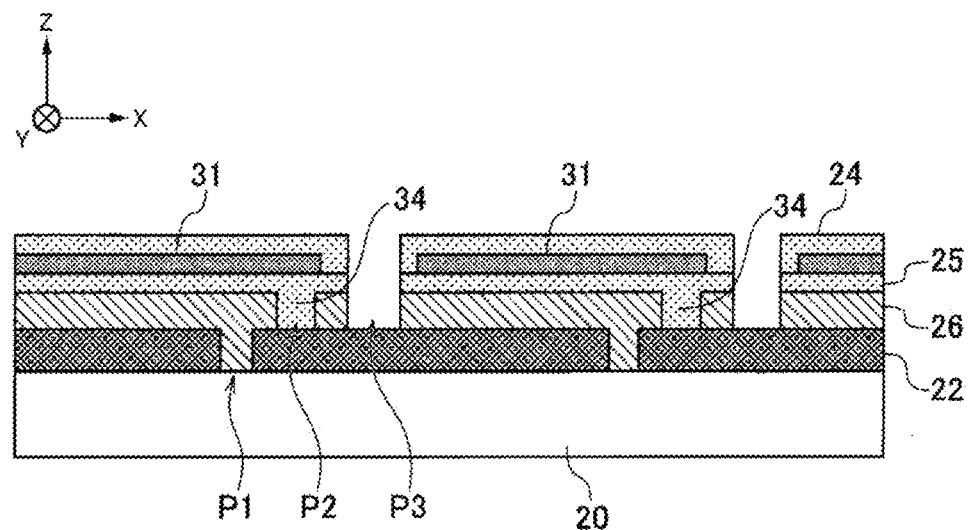
FIG. 3 is a schematic cross-sectional view of the photoelectric conversion module taken along line 3A-3A in FIG. 2.
Figure 4:
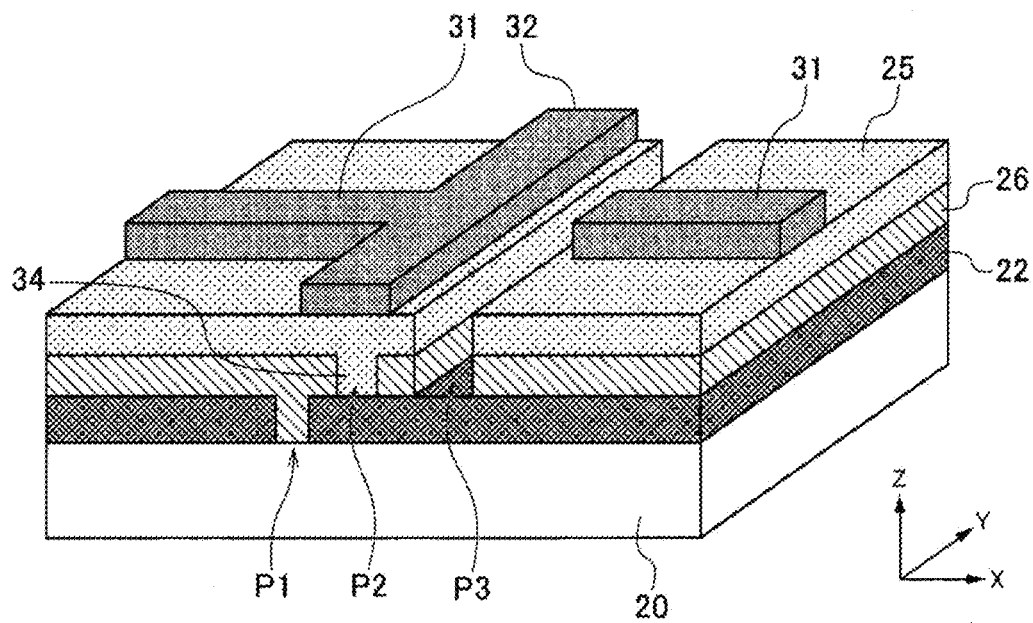
FIG. 4 is a schematic perspective view of the photoelectric conversion module in a region 4R in FIG. 2.
Figure 5:
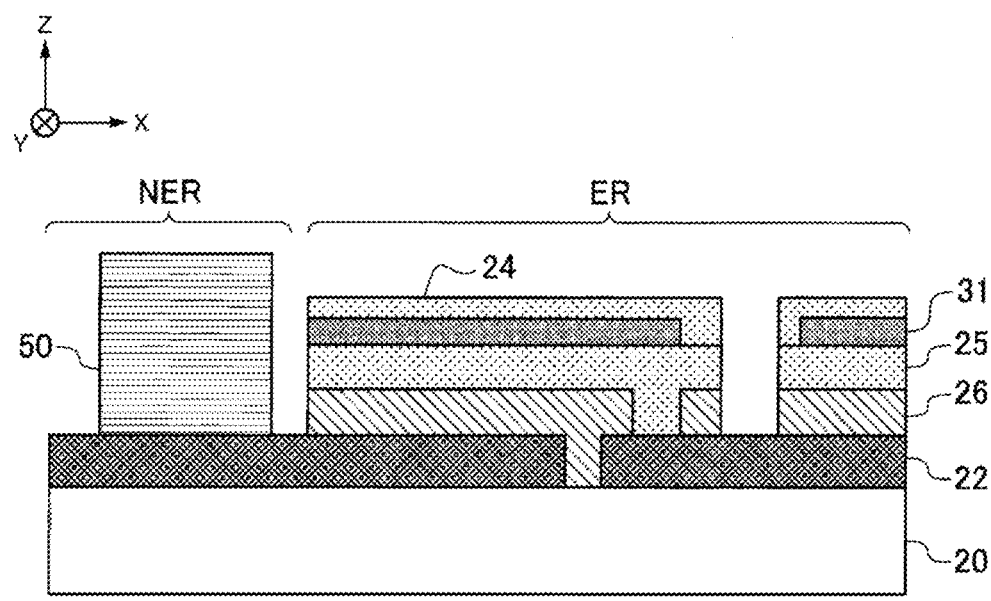
FIG. 5 is a schematic cross-sectional view of the photoelectric conversion module taken along line 5A-5A in FIG. 1.
Figure 6:
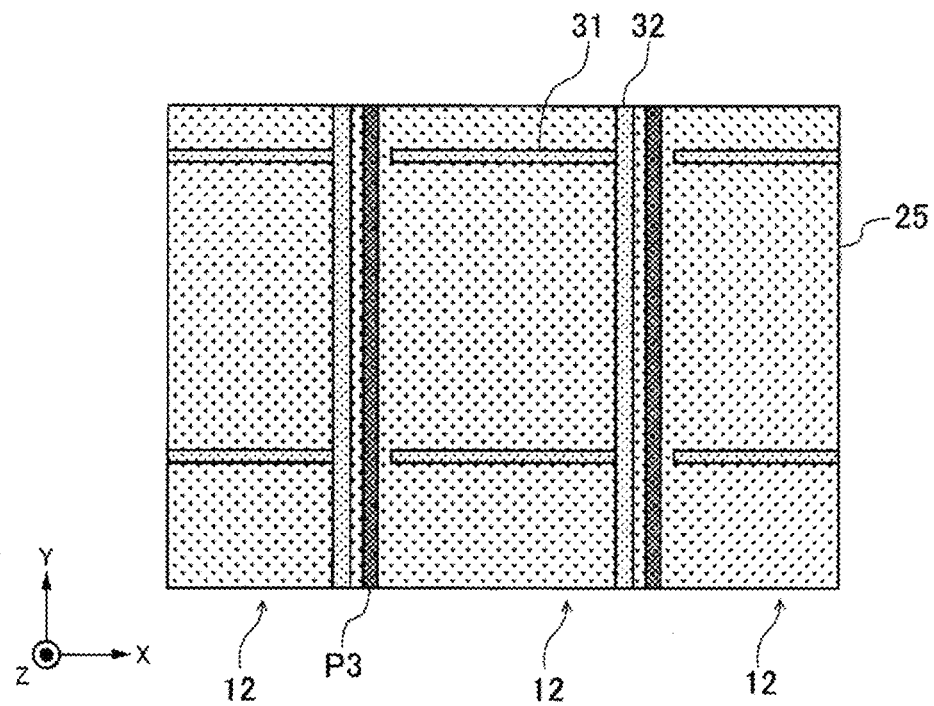
FIG. 6 is a schematic top view of the photoelectric conversion module in a region 6R in FIG. 1.
Figure 7:
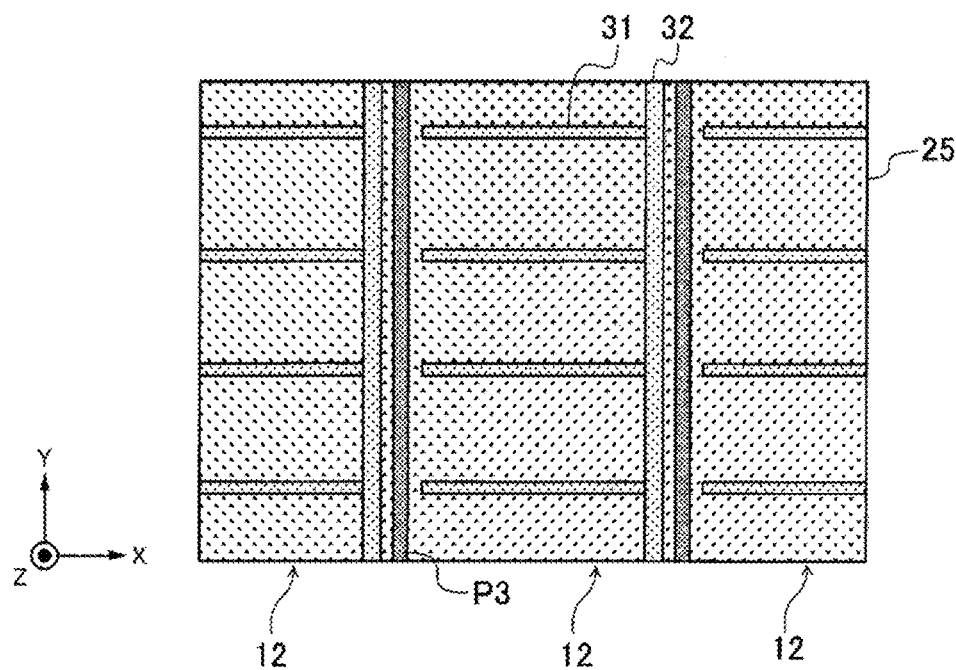
FIG. 7 is a schematic top view of the photoelectric conversion module in a region 7R in FIG. 1.

FIG. 1 is a schematic top view of a photoelectric conversion module according to a first embodiment. FIG. 2 is a schematic top view of the photoelectric conversion module in a region 2R in FIG. 1. FIG. 3 is a schematic cross-sectional view of the photoelectric conversion module taken along line 3A-3A in FIG. 2. FIG. 4 is a schematic perspective view of the photoelectric conversion module in a region 4R in FIG. 2. FIG. 5 is a schematic cross-sectional view of the photoelectric conversion module taken along line 5A-5A in FIG. 1 FIG. 6 is a schematic top view of the photoelectric conversion module in a region 6R in FIG. 1. FIG. 7 is a schematic top view of the photoelectric conversion module in a region 7R in FIG. 1.

Note that, in FIGS. 2, 6 and 7, a lower layer than a second electrode layer 24 described later is drawn in perspective for convenience. Moreover, FIG. 4 does not illustrate a second electrode layer 24 described later in order to show a structure of a photoelectric conversion cell clearly for convenience.

A photoelectric conversion module 10 according to the present embodiment may be an integrated thin-film photoelectric conversion module including a plurality of photoelectric conversion cells 12 integrated on a substrate 20. Preferably, the photoelectric conversion module 10 is a solar cell module that converts light energy into electric energy. The substrate 20 may be made of, for example, glass, ceramics, resin, metal, or the like.

The photoelectric conversion cell 12 may have a substantially band shape when viewed from a direction orthogonal to a main surface of the substrate 20. Each of the photoelectric conversion cells 12 may extend long in a first direction (the Y direction in the drawing). The plurality of photoelectric conversion cells 12 are arranged side by side in a second direction (the X direction in the drawing) intersecting the first direction. The photoelectric conversion cells 12 adjacent to each other may be divided from each other by division parts P1, P2, P3 extending in the first direction.

Each of the photoelectric conversion cells 12 may include at least a first electrode layer 22, a second electrode layer 24 and a photoelectric conversion layer 26. The photoelectric conversion layer 26 is provided between the first electrode layer 22 and the second electrode layer 24. The first electrode layer 22 is provided between the photoelectric conversion layer 26 and the substrate 20. The second electrode layer 24 is located on opposite side of the photoelectric conversion layer 26 to the substrate 20.

In the present embodiment, the second electrode layer 24 may be formed of a transparent electrode layer. When the second electrode layer 24 is formed of a transparent electrode layer, light incident on the photoelectric conversion layer 26 or emitted from the photoelectric conversion layer 26 passes through the second electrode layer 24.

When the second electrode layer 24 is formed of a transparent electrode layer, the first electrode layer 22 may be formed of an opaque electrode layer or may be formed of a transparent electrode layer. In an example of a CIS-based photoelectric conversion module, it is preferable that the first electrode layer 22 is formed of a metal such as molybdenum, titanium or chromium, for example, from the viewpoint of corrosion resistance to Group VI elements.

In the present embodiment, as a preferred example, the second electrode layer 24 is formed of an n-type semiconductor, more specifically, a material having n-type conductivity, a wide bandgap, and relatively low resistance. The second electrode layer 24 may be made of, for example, zinc oxide (ZnO) added with a group III element or indium tin oxide (ITO). In this case, the second electrode layer 24 can function as both an n-type semiconductor and a transparent electrode layer.

The photoelectric conversion layer 26 may include, for example, p-type semiconductor. In an example of a CIS-based photoelectric conversion module, the photoelectric conversion layer 26 is formed of a compound semiconductor including a group I element (Cu, Ag, Au, or the like), a group III element (Al, Ga, In, or the like), and a group VI element (O, S, Se, Te, or the like). The photoelectric conversion layer 26 is not limited to those described above, and may be made of any material that causes photoelectric conversion.

It should be noted that the configuration of the photoelectric conversion cell 12 is not limited to the above-described embodiment, and can take various embodiments. For example, the photoelectric conversion cell 12 may have a configuration in which both an n-type semiconductor and a p-type semiconductor are sandwiched between the first electrode layer and the second electrode layer. In this case, the second electrode layer may not be formed of an n-type semiconductor. Furthermore, the photoelectric conversion cell 12 is not limited to a p-n junction structure, and may have a p-i-n junction structure including an intrinsic semiconductor layer (i-type semiconductor) between an n-type semiconductor and a p-type semiconductor.

The first electrode layers 22 of the photoelectric conversion cells 12 adjacent to each other are electrically divided from each other by the division part P1. Similarly, the second electrode layers 24 of the photoelectric conversion cells 12 adjacent to each other are electrically divided from each other by the division part P3. The photoelectric conversion layers 26 of the photoelectric conversion cells 12 adjacent to each other are divided from each other by the division parts P2, P3.

The photoelectric conversion module 10 may have an electrical connection part 34 between the photoelectric conversion cells 12 adjacent to each other. The electrical connection part 34 electrically connects the photoelectric conversion cells 12 adjacent to each other in series.

The electrical connection part 34 extends in the thickness direction of the photoelectric conversion module 10 at the second division part P2, thereby electrically connecting the first electrode layer 22 of one photoelectric conversion cell 12 and the second electrode layer 24 of the other photoelectric conversion cell 12 to each other.

The photoelectric conversion module 10 has a plurality of first grid electrodes 31 arrayed in the first direction (the Y direction in the drawing) in each photoelectric conversion cell 12. Each first grid electrode 31 extends in the second direction (the X direction in the drawing) intersecting the first direction. The first grid electrode 31 may be provided between the photoelectric conversion layers 26 and the second electrode layer 24 in each photoelectric conversion cell 12. The first grid electrode 31 may be made of a material having higher conductivity than that of the transparent electrode layer forming the second electrode layer 24. The first grid electrode 31 may be in direct contact with the transparent electrode layer. The width of the first grid electrode 31 in the first direction (the Y direction in the drawing) may be, for example, 5 to 100 µm. The thickness of the first grid electrode 31 may be, for example, 0.1 to 20 µm.

If necessary, the second grid electrode 32 extending in the first direction (the Y direction in the drawing) may be provided at an end of the first grid electrode 31 in the second direction (the X direction in the drawing). The second grid electrode 32 is coupled to the first grid electrode 31 at one end of the first grid electrode 31. The width of the second grid electrode 32 in the second direction (the X direction in the drawing) may be, for example, 5 to 200 µm. The thickness of the second grid electrode 32 may be, for example, 0.1 to 20 µm.

The first grid electrode 31 and/or the second grid electrode 32 are provided between the photoelectric conversion layer 26 and the second electrode layer (transparent electrode layer) 24. That is, the first grid electrode 31 and/or the second grid electrode 32 are covered with the transparent electrode layer. As a result, connection failure of the first grid electrode 31 and/or the second grid electrode 32 to the transparent electrode can be suppressed. Therefore, it is possible to suppress a decrease in the current collection ability of the first grid electrode 31 and/or the second grid electrode 32, and as a result, it is possible to suppress a decrease in the conversion efficiency of the photoelectric conversion module.

Further, as illustrated in FIG. 3, it is preferable that the first grid electrode 31 and/or the second grid electrode 32 be separated from the photoelectric conversion layer 26 in the thickness direction. In the embodiment illustrated in FIG. 3, the first grid electrode 31 and/or the second grid electrode 32 are separated from the photoelectric conversion layer 26 via the transparent electrode layer 25 in the thickness direction. That is, the first grid electrode 31 and/or the second grid electrode 32 are sandwiched between the two transparent electrode layers in the thickness direction. Here, the two transparent electrode layers 24, 25 may be made of the same material or may be made of different materials. In the present embodiment, since the first grid electrode 31 and/or the second grid electrode 32 are sandwiched between the transparent electrode layers, connection failure of the first grid electrode 31 and/or the second grid electrode 32 to the transparent electrode can be suppressed more.

In the present embodiment, the electrical connection part 34 is formed by a portion continuous from the transparent electrode layer 25. In this case, the electrical connection part 34 may be made of the same material as that of the transparent electrode layer 25. Alternatively, the electrical connection part 34 may be made of a conductive material different from that of the transparent electrode layer 25. For example, the electrical connection part 34 may be made of the same material as that of the first grid electrode 31 or the second grid electrode 32.

It is preferable that the thickness of at least one of the first grid electrode 31 and the second grid electrode 32 (or the electrical connection part 34) at the intersection of the first grid electrode 31 and the second grid electrode 32 (or the electrical connection part 34), preferably both of those is larger than the thickness of the first grid electrode 31 and the second grid electrode 32 (or the electrical connection part 34) at a position away from the intersection. For example, the thickness of the first grid electrode 31 may be gradually increased toward the intersection of the first grid electrode 31 and the second grid electrode 32 (or the electrical connection part 34). Further, the thickness of the second grid electrode 32 (or the electrical connection part 34) may be gradually increased toward the intersection of the first grid electrode 31 and the second grid electrode 32 (or the electrical connection part 34).

When light is applied to the photoelectric conversion layer 26 of each photoelectric conversion cell 12, an electromotive force is generated, and the first electrode layer 22 and the second electrode layer 24 become a positive electrode and a negative electrode, respectively. Therefore, a part of the free electrons generated in a certain photoelectric conversion cell 12 moves from the second electrode layer 24 (or the transparent electrode layer 25) to the first electrode layer 22 of the adjacent photoelectric conversion cell 12 through the electrical connection part 34. Further, another part of the free electrons generated in a certain photoelectric conversion cell 12 passes through the electrical connection part 34 from the second electrode layer (or the transparent electrode layer 25) via the first grid electrode 31 and the second grid electrode 32, and moves to the first electrode layer 22 of the adjacent photoelectric conversion cells 12. As described above, free electrons generated in the photoelectric conversion cells 12 flow through the plurality of photoelectric conversion cells 12 in the second direction (the X direction in the drawing).

The photoelectric conversion module 10 has an electric wire 50 for supplying power to the photoelectric conversion module 10 or extracting power from the photoelectric conversion module 10. The wire 50 may be provided adjacent to the photoelectric conversion cell 12 located at the end of the photoelectric conversion module 10 in the second direction (the X direction in the drawing).

In the present embodiment, the transparent electrode layers 24, 25 may include a region 2R as illustrated in FIG. 2 and a region 6R as illustrated in FIG. 6. The region 2R and the region 6R are arranged in the same photoelectric conversion cell 12. The interval between the first grid electrodes 31 adjacent to each other in the first direction (Y direction) in the region 2R is smaller than the interval between the first grid electrodes 31 adjacent to each other in the first direction (Y direction) in the region 6R. Here, the region 6R of the transparent electrode layers 24, 25 have sheet resistance smaller than the sheet resistance in the region 2R, a film thickness larger than the film thickness in the region 2R, or transmittance smaller than the transmittance in the region 2R. Note that the above-mentioned interval between the first grid electrodes 31 is an interval between a center line of an arbitrary first grid electrode 31 and a center line of an adjacent first grid electrode 31.

The sheet resistance, the film thickness and the transmittance of the transparent electrode layers 24, 25 are specified respectively by the sheet resistance, the film thickness, and the transmittance of the laminate composed of the transparent electrode layer constituting the second electrode layer 24 and the transparent electrode layer 25. However, as described later, when the transparent electrode layer 25 does not exist, the sheet resistance, the film thickness, and the transmittance of the transparent electrode layers 24, 25 described above can be read respectively as the sheet resistance, the film thickness, and the transmittance of only the transparent electrode layer constituting the second electrode layer 24 (the same applies hereinafter).

In the present embodiment, the transparent electrode layers 24, 25 may further include a region 7R as illustrated in FIG. 7. The region 6R and the region 7R are arranged in different photoelectric conversion cells 12.

The interval between the first grid electrodes 31 adjacent to each other in the first direction (Y direction) in the region 7R is smaller than the interval between the first grid electrodes 31 adjacent to each other in the first direction (Y direction) in the region 6R. Here, the region 6R of the transparent electrode layers 24, 25 have sheet resistance smaller than the sheet resistance in the region 7R, a film thickness larger than the film thickness in the region 7R, or transmittance smaller than the transmittance in the region 7R.

More preferably, the transparent electrode layers 24, 25 of the photoelectric conversion module 10 has a distribution of the sheet resistance, film thickness or transmittance, and the interval between the first grid electrodes 31 adjacent to each other in the first direction (Y direction) is smaller as the sheet resistance is larger, smaller as the film thickness is smaller, or smaller as the transmittance is larger.

The distribution of the electric resistance value of the total of the transparent electrode layers 24, 25 and the first grid electrode 31 approaches uniform as the sheet resistance of the transparent electrode layer in a region is larger when the interval between the first grid electrodes 31 is narrowed in such a region. As described above, the overall sheet resistance is made nearly uniform, and the density of the first grid electrode 31 in an unnecessary region (area density of the grid electrode per unit area when the photoelectric conversion module is viewed in plan view) is reduced, so that it is possible to balance both solving the problem of power loss due to the electric resistance value of the transparent electrode layer and solving the problem of reduction of short-circuit current due to light shielding by the first grid electrode.

In general, it is considered that the smaller the film thickness of the transparent electrode layer, the higher the sheet resistance of the transparent electrode layer. Moreover, it is considered that the higher the transmittance of the transparent electrode layer, the higher the sheet resistance of the transparent electrode layer. It is considered that this is because when the transmittance of the transparent electrode layer is high, the film thickness of the transparent electrode layer is generally small or the carrier concentration of the transparent electrode layer is low.

Therefore, it is considered that, as the film thickness of the transparent electrode layer is smaller, or as the transmittance of the transparent electrode layer is larger, by narrowing the interval between the first grid electrodes 31, the distribution of the electric resistance value of the total of the transparent electrode layer and the first grid electrode 31 approaches uniform. Even in this case, the overall sheet resistance is made nearly uniform, and the density of the first grid electrode 31 in an unnecessary region is reduced, so that it is possible to balance both solving the problem of power loss due to the electric resistance value of the transparent electrode layer and solving the problem of reduction of short-circuit current due to light shielding by the first grid electrode.

The film thickness or transmittance of the transparent electrode layer can be more easily measured in a production line than the sheet resistance of the transparent electrode layer. Therefore, when the interval between the first grid electrodes 31 is set according to the film thickness or the transmittance of the transparent electrode layer, there is a high merit in manufacturing the photoelectric conversion module 10.

Figure 8:
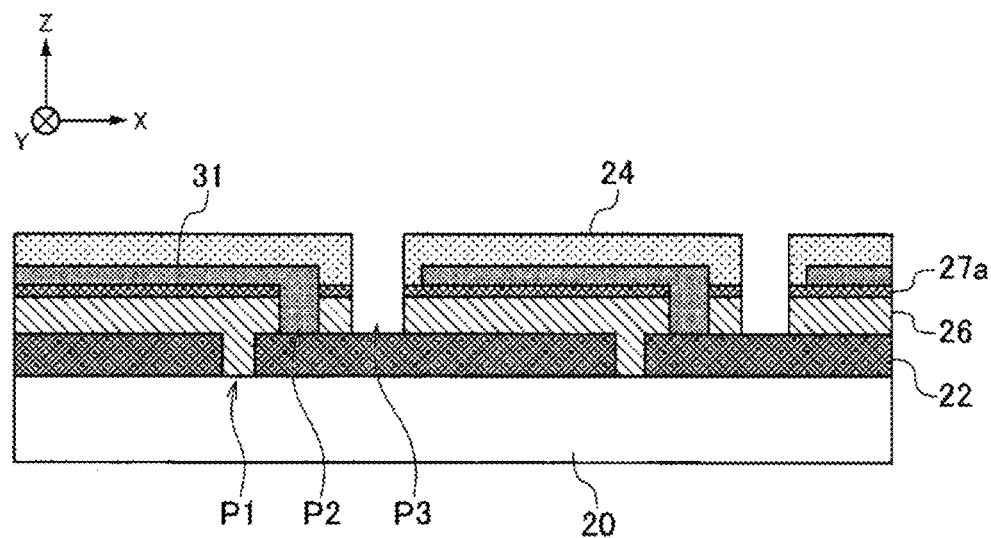
FIG. 8 is a schematic cross-sectional view of a photoelectric conversion module according to a second embodiment.

FIG. 8 is a schematic cross-sectional view of the photoelectric conversion module according to a second embodiment. Hereinafter, the description of the same configuration as that of the first embodiment may be omitted. In the photoelectric conversion module according to the second embodiment, the first grid electrode 31 and the second grid electrode 32 are covered with the second electrode layer 24. Further, the first grid electrode 31 and the second grid electrode 32 are separated from the photoelectric conversion layer 26 in the thickness direction. In the present embodiment, the first grid electrode 31 and the second grid electrode 32 are separated from the photoelectric conversion layer 26 via a first buffer layer 27a in the thickness direction.

The first buffer layer 27a may be a semiconductor material having the same conductivity type as the second electrode layer 24, or may be a semiconductor material having a different conductivity type. It is sufficient that the first buffer layer 27a is made of a material having higher electric resistance than that of the second electrode layer 24. In an example of the CIS-based photoelectric conversion module, the first buffer layer 27a may be a Zn-based buffer layer, a Cd-based buffer layer, or an In-based buffer layer. The Zn-based buffer layer may be, for example, ZnS, ZnO, Zn(OH) or ZnMgO, or a mixed crystal or a laminate thereof. The Cd-based buffer layer may be, for example, CdS, CdO or Cd(OH), or a mixed crystal or a laminate thereof. The In-based buffer layer may be, for example, InS, InO or In(OH), or a mixed crystal or a laminate thereof.

Figure 9:
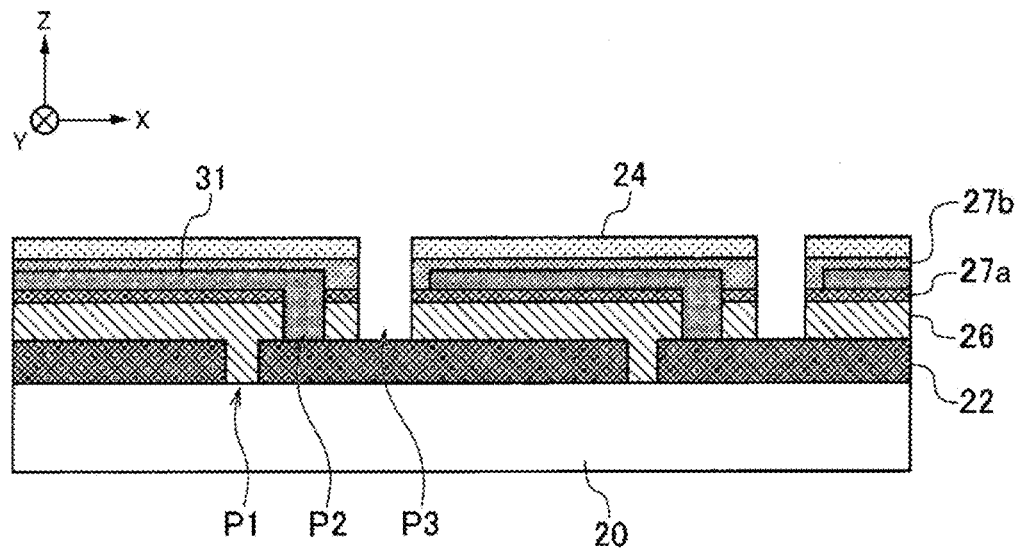
FIG. 9 is a schematic cross-sectional view of a photoelectric conversion module according to a third embodiment.

FIG. 9 is a schematic cross-sectional view of a photoelectric conversion module according to a third embodiment. In the photoelectric conversion module according to the third embodiment, the first grid electrode 31 and the second grid electrode 32 are covered with the second electrode layer 24. The first grid electrode 31 and the second grid electrode 32 are separated from the photoelectric conversion layer 26 via the first buffer layer 27a in the thickness direction. Further, the photoelectric conversion cell 12 has a second buffer layer 27b between the second electrode layer 24 and the grid electrodes 31, 32. That is, the first grid electrode 31 and the second grid electrode 32 may be sandwiched between the first buffer layer 27a and the second buffer layer 27b in the thickness direction.

The second buffer layer 27b may be a semiconductor material having the same conductivity type as the second electrode layer 24, or may be a semiconductor material having a different conductivity type. In an example of the CIS-based photoelectric conversion module, the second buffer layer 27b may be a Zn-based buffer layer, a Cd-based buffer layer or an In-based buffer layer as described above. The material forming the second buffer layer 27b may be the same as or different from that of the first buffer layer 27a.

Figure 10:
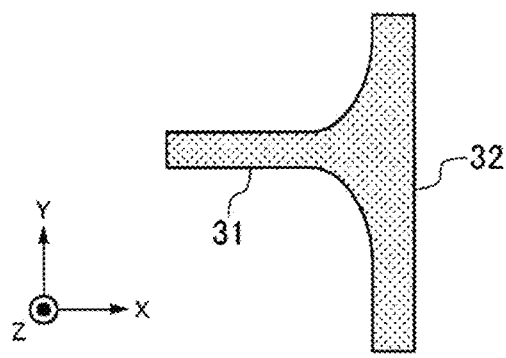
FIG. 10 is a schematic top view of a connection portion between a first grid electrode and a second grid electrode according to a first modification.

FIG. 10 is a schematic top view of a connection portion between the first grid electrode 31 and the second grid electrode 32 according to a first modification. In the first modification, the width of the first grid electrode 31 in the first direction (Y direction) increases as approaching the second grid electrode 32. Specifically, the width of the first grid electrode 31 in the first direction (Y direction) gradually increases as approaching the second grid electrode 32.

Conversely, the width of the second grid electrode 32 in the second direction (X direction) may gradually increase as approaching the first grid electrode 31.

Figure 11:
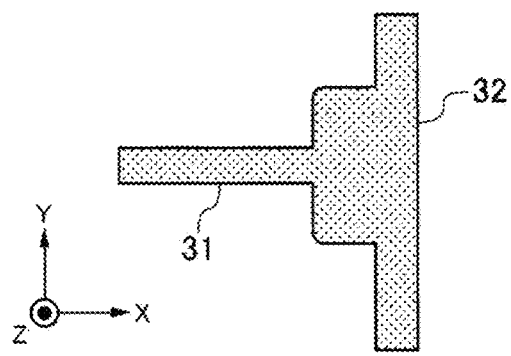
FIG. 11 is a schematic top view of a connection portion between a first grid electrode and a second grid electrode according to a second modification.

FIG. 11 is a schematic top view of a connection portion between the first grid electrode 31 and the second grid electrode 32 according to a second modification. In the second modification, the width of the first grid electrode 31 in the first direction (Y direction) increases as approaching the second grid electrode 32. Specifically, the width of the first grid electrode 31 in the first direction (Y direction) increases as approaching the second grid electrode 32 step by step.

Conversely, the width of the second grid electrode 32 in the second direction (X direction) may gradually increase as approaching the first grid electrode 31 step by step.

In the first modification and the second modification, the region of the connection portion between the first grid electrode 31 and the second grid electrode 32 is increased, so that the electrical connection failure or increase in electric resistance at the connection portion between the first grid electrode 31 and the second grid electrode 32 can be suppressed.

Figure 12:
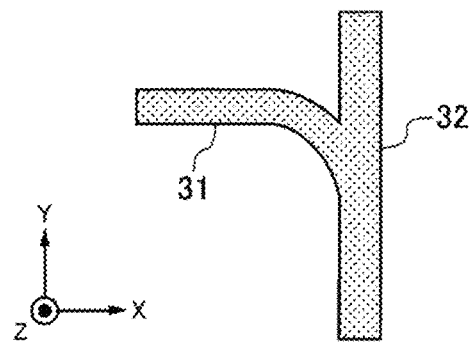
FIG. 12 is a schematic top view of a connection portion between a first grid electrode and a second grid electrode according to a third modification.
Figure 13:
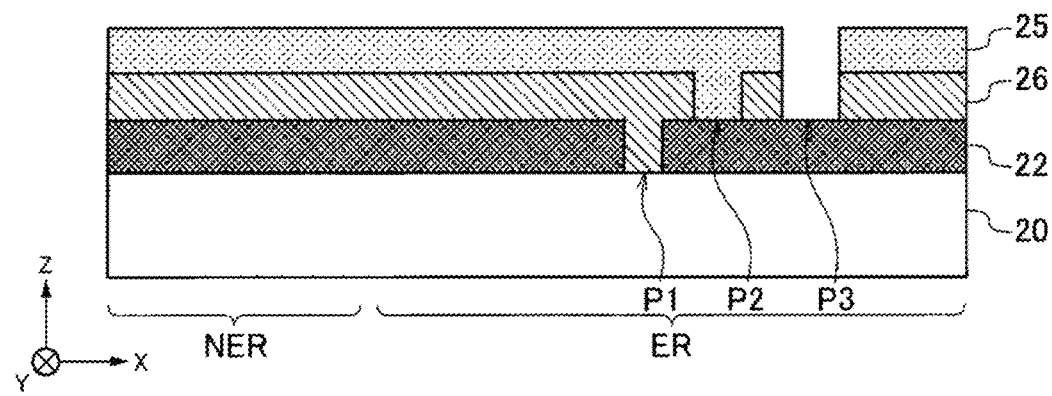
FIG. 13 is a schematic cross-sectional view illustrating a cell forming step in a method for manufacturing a photoelectric conversion module.

FIG. 12 is a schematic top view of the coupling portion between the first grid electrode 31 and the second grid electrode 32 according to a third modification. In the third modification, the first grid electrode 31 bends in the first direction (Y direction) as it approaches the second grid electrode 32. Since the coupling location between the first grid electrode 31 and the second grid electrode 32 is bent as described above, the reflection of the current flowing through the first grid electrode 31 at the coupling location can be reduced.

As another modification, the first grid electrode 31 may increase in thickness as it approaches the second grid electrode 32.

Next, with reference to FIGS. 13 to 18, a method for manufacturing a photoelectric conversion module according to an embodiment will be described. FIGS. 13 to 18 illustrate a method for the photoelectric conversion module according to the first embodiment. Note that, in the following steps, each layer can be appropriately formed by a film forming means such as a sputtering method or an evaporation method.

First, on the substrate 20, the band-shaped photoelectric conversion cell 12 including the first electrode layer 22, the transparent electrode layer 25, and the photoelectric conversion layer 26 between the first electrode layer 22 and the transparent electrode layer 25 is formed (cell forming step). Specifically, first, a material forming the first electrode layer 22 is formed on the substrate 20. The material constituting the first electrode layer 22 is formed in a region extending over the plurality of photoelectric conversion cells 12. The materials of the substrate 20 and the first electrode layer 22 are as described above. Next, a part of the material constituting the first electrode layer 22 is removed in a thin line shape to form a first division part P1 for forming the first electrode layer 22 into a plurality of band shapes. The removal of a part of the material constituting the first electrode layer 22 can be performed by a means such as a laser or a needle.

Next, a material forming the photoelectric conversion layer 26 is formed on the first electrode layer 22. The material of the photoelectric conversion layer 26 is as described above. At this time, the material forming the photoelectric conversion layer 26 may be filled also in the first division part P1. Alternatively, the first division part P1 may be filled with another insulating member different from the material forming the photoelectric conversion layer 26. Next, a part of the material constituting the photoelectric conversion layer 26 is removed in a thin line shape to form a second division part P2 for forming the photoelectric conversion layer 26 into a plurality of band shapes.

Next, a material forming the transparent electrode layer 25 is formed on the photoelectric conversion layer 26. The material of the transparent electrode layer 25 is as described above. The material forming the transparent electrode layer 25 may be filled also in the second division part P2. The transparent electrode layer 25 filled also in the second division part P2 forms the electrical connection part 34 as described above. Alternatively, the inside of the second division part P2 may be filled with another conductive material different from the material forming the transparent electrode layer 25.

The method for manufacturing the photoelectric conversion module may include a step of measuring the sheet resistance, film thickness, or transmittance of the transparent electrode layer forming the transparent electrode layers 24, 25. The sheet resistance of the transparent electrode layers 24, 25 can be measured by, for example, a four-terminal resistance measuring instrument or a resistance measuring instrument utilizing the Hall effect. The film thickness of the transparent electrode layers 24, 25 can be measured by, for example, a spectrophotometer, a light interference type film thickness meter, SEM (a scanning electron microscope), a step meter, or a laser microscope. The transmittance of the transparent electrode layer can be measured by, for example, a spectrophotometer.

The measurement of the sheet resistance, film thickness, or transmittance of the transparent electrode layer may be performed on a photoelectric conversion module used as a finished product, on a dummy photoelectric conversion module not used as a finished product, or on a dummy glass substrate. When the photoelectric conversion module 10 is mass-produced, the distribution of the sheet resistance, film thickness, or transmittance of the transparent electrode layer is substantially the same between products in the same production line (or lot). Therefore, a product not used as a finished product, for example, a semi-finished product formed on the substrate 20 up to the photoelectric conversion layer 26, or a dummy glass substrate on which a transparent electrode layer is formed may be taken out, and the sheet resistance, film thickness, or transmittance of the transparent electrode layer for the taken-out semi-finished product or the dummy glass substrate may be measured. This makes it possible to estimate the sheet resistance, film thickness, or transmittance of the transparent electrode layer of the photoelectric conversion module 10 used as a product in the same production line (or lot).

When two transparent electrode layers 24, 25 are overlapped in the finished product as in the present embodiment, it is sufficient that the sheet resistance, film thickness or transmittance of the entire two transparent electrode layers 24, 25 is measured or estimated. Alternatively, when the finished product has only one second electrode layer 24 as a transparent electrode layer, it is sufficient that the sheet resistance, film thickness or transmittance of one transparent electrode layer 24 may be measured or estimated.

The method for manufacturing the photoelectric conversion module may include a grid forming step of forming grid electrodes 31, 32 after the cell forming step. The grid forming step may include a first grid forming step and a second grid forming step. The first grid forming step may be performed at any timing before or after the second grid forming step. The grid forming step may be performed before the third division part P3 is formed.

In the first grid forming step, a plurality of first grid electrodes 31 provided arrayed in the photoelectric conversion cell 12 in the first direction (the Y direction in the drawing) and extending in the second direction (the X direction in the drawing) intersecting the first direction are formed. In the second grid forming step, the second grid electrode 32 extending in the first direction (the Y direction in the drawing) as described above is formed.

The first grid electrode 31 and/or the second grid electrode 32 can be formed by, for example, inkjet printing, screen printing, gravure offset printing, or flexographic printing. Hereinafter, an example in a case where the first grid electrode 31 and the second grid electrode 32 are formed by applying a conductive ink, for example, inkjet printing will be described with reference to FIGS. 14 and 15.

A conductive ink 102 may be formed of a conductive paste containing conductive particles such as silver and copper, an organic solvent, and a dispersant. The conductive ink 102 may include a binder as needed. The conductive ink 102 is formed on the transparent electrode layers 24, 25 by being discharged from the nozzle 100. The conductive ink 102 is preferably fired after being applied. By firing the conductive ink 102, the organic solvent and the dispersant are vaporized, and the conductive particles remain in a predetermined application pattern. As a result, the first grid electrode 31 and the second grid electrode 32 are formed.

In the present embodiment, the conductive ink 102 is provided on the transparent electrode layer 25. Alternatively, the conductive ink 102 may be provided on the first buffer layer 27a according to the various embodiments described above. The present invention is not limited to these examples, and it is sufficient that the conductive ink 102 is provided above the photoelectric conversion layer 26.

In an example, the firing temperature of the conductive ink 102 may be in the range of 100° C. to 200° C. In the case of the above-described CIS-based photoelectric conversion module, the firing temperature of the conductive ink 102 is preferably 150° C. or lower in order to suppress the deterioration and destruction of the photoelectric conversion cells constituting the CIS-based photoelectric conversion module. The firing of the conductive ink 102 is more preferably performed in the air (more preferably, in dry air) or in a nitrogen atmosphere. The firing time may be within a range from 5 to 60 minutes, for example. The firing of the conductive ink may be performed during a heating step of forming the second electrode layer 24. Specifically, when the second electrode layer 24 is formed by a sputtering method, a MOCVD method or an ion plating method, a heating step (a preheating step or a film formation heating step) is present. Since the heating step for forming the second electrode layer 24 is performed at 100 to 200° C., the conductive ink may be fired in this heating step.

Figure 14:
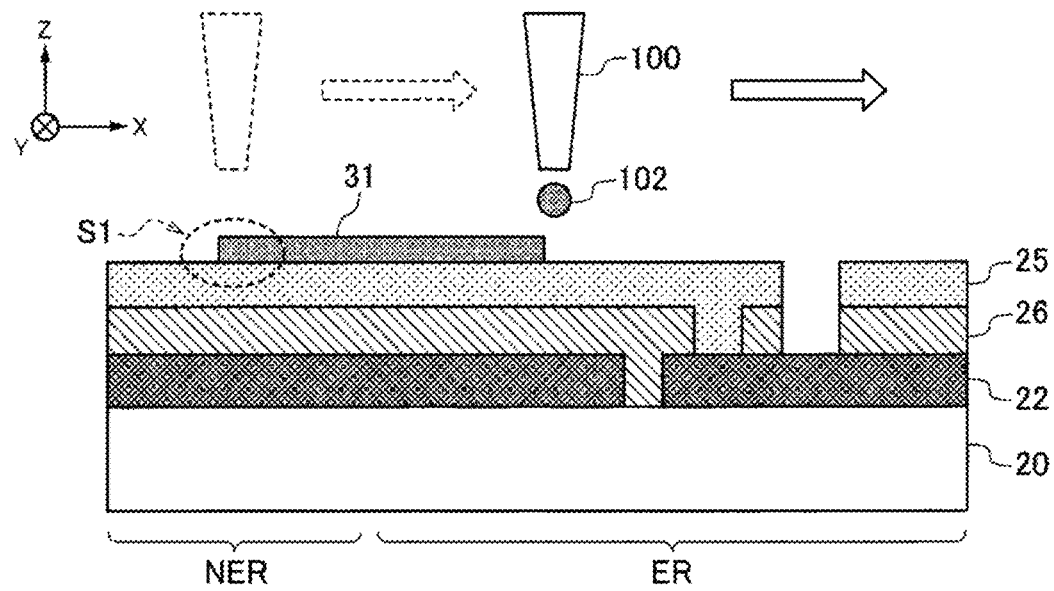
FIG. 14 is a schematic view illustrating a first grid forming step of forming a first grid electrode.

Preferably, in the first grid forming step, a start point S1 at which the application of the conductive ink 102 is started in one photoelectric conversion module is located in a non-effective region NER which does not contribute to the electromotive force of the photoelectric conversion module (see FIG. 14). Specifically, as illustrated in FIG. 14, while the nozzle 100 of the inkjet head is moved in the second direction (X direction) from the start point S1, the conductive ink 102 is discharged from the nozzle 100, so that the conductive ink 102 is formed along the second direction.

Figure 15:
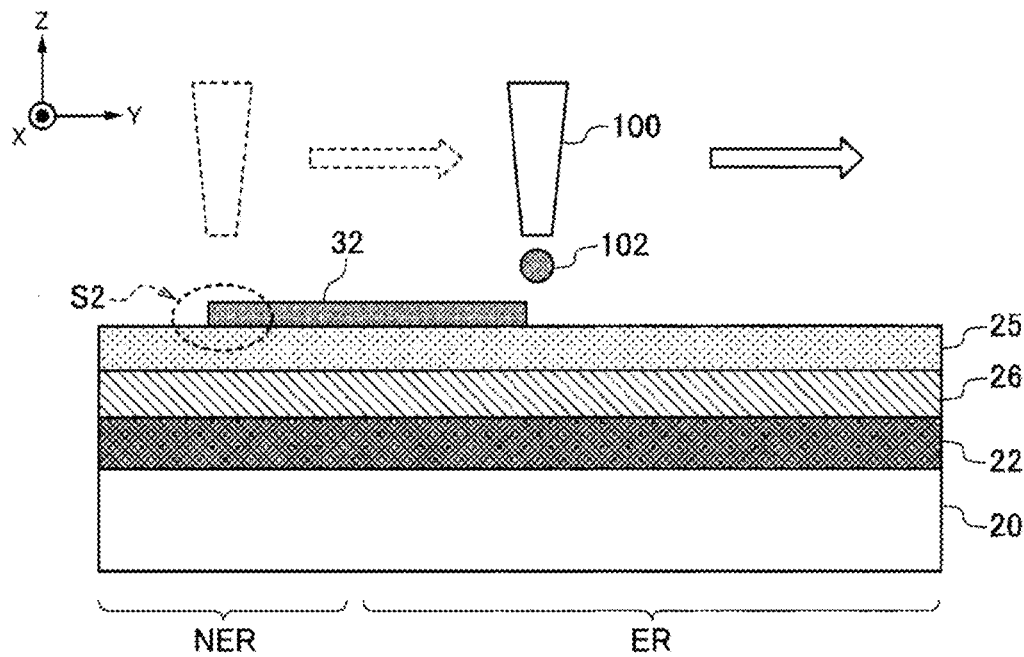
FIG. 15 is a schematic view illustrating a second grid forming step of forming a second grid electrode.

In the second grid forming step, it is preferable that a start point S2 at which the application of the conductive ink 102 is started in one photoelectric conversion module is located in a non-effective region NER which does not contribute to the electromotive force of the photoelectric conversion module (see FIG. 15). Specifically, as illustrated in FIG. 15, while the nozzle 100 of the inkjet head is moved in the first direction (Y direction) from the start point S2, the conductive ink 102 is discharged from the nozzle 100, so that the conductive ink 102 is formed along the second direction.

The above-described non-effective region NER is defined by a region which does not contribute to photoelectric conversion during a stage of manufacture or after completion of a product. The non-effective region NER may be, for example, a region in which the at least the second electrode layer 24 is cut out, a region that does not contribute to the photoelectric conversion separated by cutting out of the first electrode layer 22, the photoelectric conversion layer 26, and the second electrode layer 24 from the photoelectric conversion cells 12 that contribute to photoelectric conversion, or a region cut out from the photoelectric conversion module 10 being manufactured.

When the photoelectric conversion module is mass-produced, there may be a period (lead time) in which the conductive ink 102 is not applied before starting the ink application to the start points S1, S2. If the conductive ink 102 dries during this period, the conductive ink 102 may not be accurately applied to the start points S1, S2. In the present embodiment, since the start points S1, S2 are located in the non-effective region NER, the performance of the photoelectric conversion module is hardly affected even if the conductive ink 102 is not accurately applied to the start points S1, S2.

After the grid electrode forming step, a material forming the second electrode layer 24 is formed on the transparent electrode layer 25, the first grid electrode 31 and the second grid electrode 32. The material of the second electrode layer 24 is as described above. Next, a part of the material forming the second electrode layer 24, the transparent electrode layer 25 and the photoelectric conversion layer 26 is removed in a thin line shape to form a third division part P3 for forming the second electrode layer 24, the transparent electrode layer 25 and the photoelectric conversion layer 26 into a plurality of band shapes.

Figure 16:
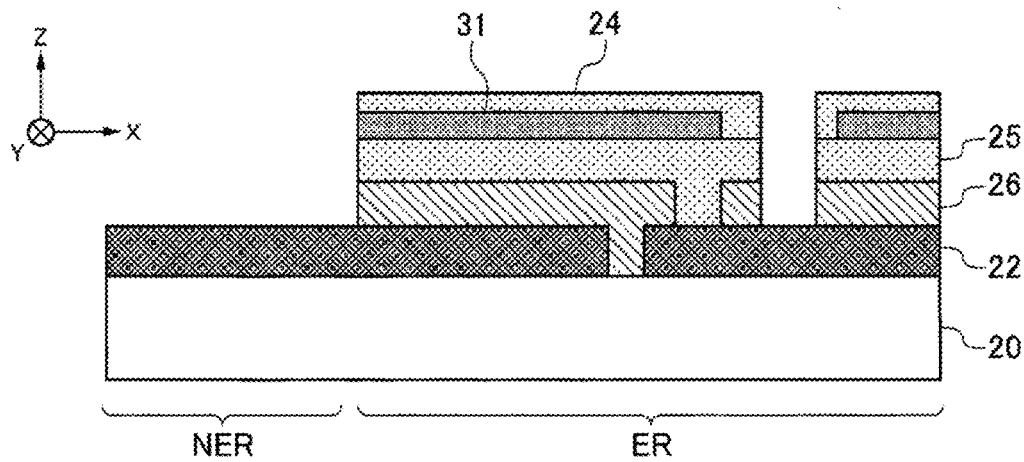
FIG. 16 is a schematic view illustrating one step of a step of forming a wire.

In a specific example, the method for manufacturing the photoelectric conversion module may include a step of removing at least a part of the second electrode layer 24 and the transparent electrode layer 25, preferably the second electrode layer 24, the transparent electrode layer 25 and the photoelectric conversion layer 26, as illustrated in FIG. 16. In the region from which at least the second electrode layer 24 and the transparent electrode layer 25 has been removed constitutes the non-effective region NER. The start point S1 at which the application of the conductive ink 102 is started may be located in the non-effective region NER.

Figure 17:
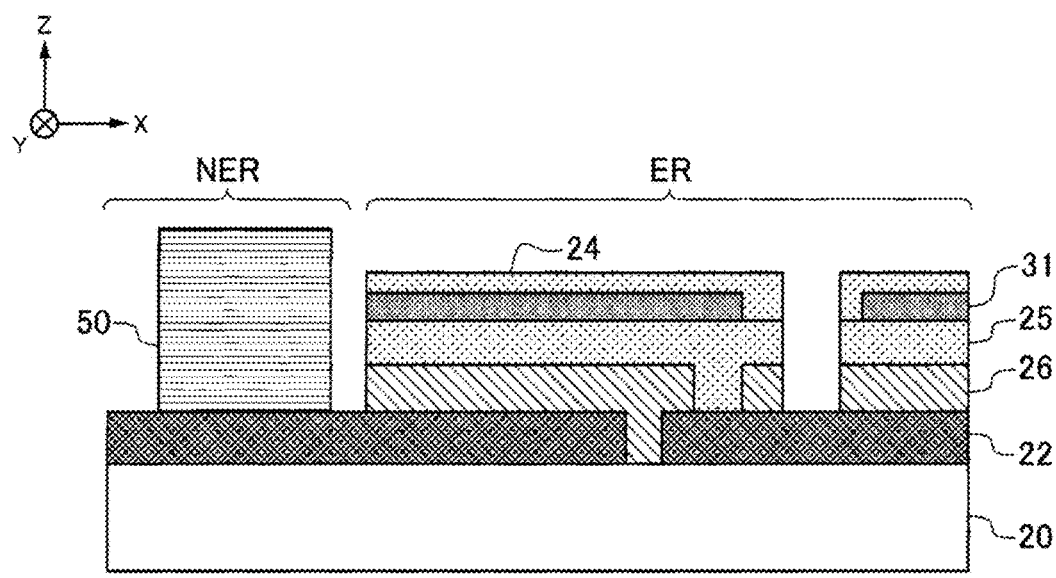
FIG. 17 is a schematic view illustrating steps subsequent to FIG. 16.

Further, as illustrated in FIG. 17, the above-described wire 50 may be formed in a region where at least the second electrode layer 24 and the transparent electrode layer 25 has been removed. In this case, the region from which at least the second electrode layer 24 and the transparent electrode layer 25 has been removed may be an end region of the photoelectric conversion module 10 in the second direction (X direction).

Figure 18:
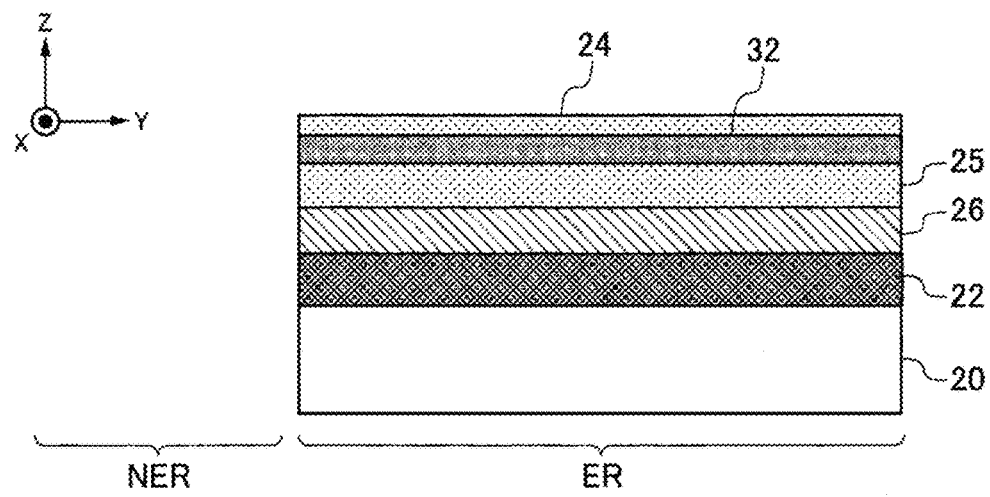
FIG. 18 is a schematic view illustrating a step of cutting out a part of the photoelectric conversion module.

In a specific example, as illustrated in FIG. 18, the method for manufacturing a photoelectric conversion module may further include a step of cutting out a region including the start point S2 at which application of the conductive ink 102 is started.

As described above, the photoelectric conversion module 10 described in the first embodiment is obtained. In FIGS. 16, 17 of the above embodiment, at least the second electrode layer 24 and the transparent electrode layer 25 at a location corresponding to the non-effective region NER is removed. The present invention is not limited to this, and the wire 50 may be formed on the second electrode layer 24 without removing the second electrode layer 24 and the transparent electrode layer 25. In this case, a division groove for dividing the non-effective region NER and the effective region ER contributing to photoelectric conversion may be formed between the wire 50 and the photoelectric conversion cell 12 adjacent to the wire 50. This division groove can be formed, for example, by removing the first electrode layer 22, the photoelectric conversion layer 26, the transparent electrode layer 25 and the second electrode layer 24.

As described above, the contents of the present invention have been disclosed through the embodiments. However, it should not be understood that the description and drawings forming a part of the present disclosure limit the present invention. From this disclosure, various alternative embodiments, examples, and operation techniques will be apparent to those skilled in the art. Therefore, the technical scope of the present invention is determined only by the matters specifying the invention according to the claims that are appropriate from the above description.

For example, the photoelectric conversion module 10 may be sealed with a transparent sealing material not illustrated.

In the illustrated embodiment, all the first grid electrodes 31 have the same length in the second direction (X direction). Alternatively, the lengths of the first grid electrodes 31 in the second direction (X direction) may be different within the same photoelectric conversion cell 12 or between different photoelectric conversion cells 12. For example, a first grid electrode that is long in the second direction (X direction) and a first grid electrode that is short in the second direction (X direction) may be arranged in a predetermined pattern in the first direction (Y direction).

Further, in the present embodiment, the thin-film photoelectric conversion module having the integrated structure (having the division parts P1 to P3) has been described as an example. However, the present invention is not limited to this, and the present invention is also applicable to a photoelectric conversion module having no integrated structure, in other words, having no division parts P1 to P3.

In the above-described embodiment, the intervals between the first grid electrodes 31 in the first direction (Y direction) are different in the same photoelectric conversion cell and/or between different photoelectric conversion cells. Alternatively, the interval between the first grid electrodes 31 may be constant within the same photoelectric conversion cell and/or between different photoelectric conversion cells.

It should be noted that the terms "first", "second", and "third" in the present specification are used to distinguish each term in this specification, and the term "first", "second," and "third" in the specification do not necessarily correspond to the terms "first," "second," and "third" in the claims.

The entire contents of Japanese Patent Application No. 2017-178370 filed on Sep. 15, 2017 are incorporated herein by reference.

INDUSTRIAL APPLICABILITY

According to the above embodiment, it is possible to suppress a decrease in the current collecting ability of the grid electrode.

REFERENCE SIGNS LIST

10 Photoelectric conversion module
12 Photoelectric conversion cell
20 Substrate
22 First electrode layer
24 Second electrode layer (n-type semiconductor)
25 Transparent electrode layer
26 Photoelectric conversion layer (p-type semiconductor)
31 First grid electrode
32 Second grid electrode
50 Wire

The invention claimed is:

1. A photoelectric conversion module comprising:
a substrate; a first electrode layer over the substrate, a photoelectric conversion layer over the first electrode layer; a first grid electrode over the photoelectric conversion layer; and a transparent electrode layer over the photoelectric conversion layer and the first grid electrode wherein:
in a region where the first grid electrode and the photoelectric conversion layer are laminated with each other, the transparent electrode layer is provided on only one side of the first grid electrode opposite to the photoelectric conversion layer in a thickness direction defined by a direction crossing to a surface of the substrate,
the first grid electrode is separated from the photoelectric conversion layer via a first buffer layer in the thickness direction, and
the first grid electrode comes in direct contact with the first buffer layer in the thickness direction.

2. The photoelectric conversion module according to claim 1, comprising a second buffer layer between the first grid electrode and the transparent electrode layer.

3. A method for manufacturing a photoelectric conversion module according to claim 1, comprising:
preparing a substrate on which a first electrode layer and a photoelectric conversion layer are formed;
providing a conductive ink for forming a first grid electrode on the photoelectric conversion layer;
a firing step of firing the conductive ink to form the first grid electrode; and
a step of forming a transparent electrode layer on the conductive ink,
wherein the firing step is performed by a heat treatment during the step of forming the transparent electrode layer.

4. The photoelectric conversion module according to claim 1, wherein the first electrode layer comprises a metal selected from group consisting of molybdenum, titanium, and chromium.

5. The photoelectric conversion module according to claim 1, wherein the transparent electrode layer comprises an n-type semiconductor selected from the group consisting of Zinc Oxide and Indium Tin Oxide.

6. The photoelectric conversion module according to claim 1, wherein the photoelectric conversion layer comprises a compound semiconductor including group I element, a group III element, and a group VI element.

7. The photoelectric conversion module according to claim 1, further comprising a first region and a second region, wherein the interval between the first grid electrodes adjacent to each other in a first direction in the first region is smaller than the interval between the first grid electrodes adjacent to each other in the first direction in the second region, wherein the first direction is a direction along the surface of the substrate.

8. The photoelectric conversion module according to claim 7, wherein the transparent electrode layer thickness is larger in the first region than in the second region.

9. The photoelectric conversion module according to claim 7, wherein the interval between the first grid electrodes adjacent to each other in the first direction is smaller as the sheet resistance of the transparent electrode layer is larger, smaller as the transparent electrode film thickness is smaller, or smaller as the transparent electrode layer transmittance is larger.

10. A photoelectric conversion module comprising:
a substrate; a first electrode layer over the substrate, a photoelectric conversion layer over the first electrode layer, a first grid electrode over the photoelectric conversion layer; a transparent electrode layer over the photoelectric conversion layer and the first grid electrode,
wherein in a region where the first grid electrode and the photoelectric conversion layer are laminated with each other, the transparent electrode layer is not provided between the first grid electrode and the photoelectric conversion layer in a thickness direction defined by a direction crossing to a surface of the substrate,
wherein the first grid electrode is separated from the photoelectric conversion layer via a first buffer layer in the thickness direction, and
wherein the first grid electrode comes in direct contact with the first buffer layer in the thickness direction.

11. The photoelectric conversion module according to claim 10, wherein the first grid electrode is in direct contact with the transparent electrode layer.

\* \* \* \* \*